United States Patent
Upputuri et al.

(10) Patent No.: US 11,768,239 B1
(45) Date of Patent: Sep. 26, 2023

(54) METHOD AND APPARATUS FOR TIMING-ANNOTATED SCAN-CHAIN TESTING USING PARALLEL TESTBENCH

(71) Applicant: Marvell Asia Pte Ltd, Singapore (SG)

(72) Inventors: Balaji Upputuri, Ongole (IN); Sreekanth G. Pai, Cochin (IN); Mallikarjunarao Thummalapalli, Bangalore (IN)

(73) Assignee: Marvell Asia Pte Ltd, Singapore (SG)

( * ) Notice: Subject to any disclaimer, the term of this patent is extended or adjusted under 35 U.S.C. 154(b) by 0 days.

(21) Appl. No.: 17/662,345

(22) Filed: May 6, 2022

Related U.S. Application Data

(60) Provisional application No. 63/187,930, filed on May 12, 2021.

(51) Int. Cl.
  *G01R 31/3185* (2006.01)

(52) U.S. Cl.
  CPC ........... *G01R 31/318594* (2013.01); *G01R 31/318536* (2013.01); *G01R 31/318552* (2013.01)

(58) Field of Classification Search
  CPC .... G01R 31/318552; G01R 31/318536; G01R 31/318594
  See application file for complete search history.

(56) References Cited

U.S. PATENT DOCUMENTS

| | | | | |
|---|---|---|---|---|
| 6,704,895 B1 * | 3/2004 | Swoboda | ....... | G01R 31/318536 714/E11.169 |
| 2008/0250288 A1 * | 10/2008 | Souef | ............ | G01R 31/318594 714/E11.155 |
| 2009/0113263 A1 * | 4/2009 | Cannon | .......... | G01R 31/318536 714/E11.155 |

OTHER PUBLICATIONS

R. Tayade and J. A. Abraham, "On-chip Programmable Capture for Accurate Path Delay Test and Characterization," 2008 IEEE International Test Conference, Santa Clara, CA, USA, 2008, pp. 1-10, (Year: 2008).*

* cited by examiner

*Primary Examiner* — Cynthia Britt

(57) ABSTRACT

A method of testing an integrated circuit device, that operates at a clock frequency and that has at least one scan chain that includes a plurality of registers separated by combinatorial logic, includes establishing a respective scan chain test pattern for testing the scan chain where the scan chain test pattern includes a respective bit for each register in the plurality of registers of the scan chain, determining in advance a respective timing delay for each pair of adjacent registers in the scan chain, and, within a single clock period of the clock frequency, applying, in parallel, each bit of the respective scan chain pattern to a respective register in the plurality of registers in the scan chain, each bit of the respective scan chain pattern being applied to its respective register at a respective temporal offset, within the single clock period, based on the respective timing delay.

20 Claims, 3 Drawing Sheets

METHOD AND APPARATUS FOR TIMING-ANNOTATED SCAN-CHAIN TESTING USING PARALLEL TESTBENCH

CROSS REFERENCE TO RELATED APPLICATION

This disclosure claims the benefit of copending, commonly-assigned U.S. Provisional Patent Application No. 63/187,930, filed May 12, 2021, which is hereby incorporated by reference herein in its entirety.

FIELD OF USE

This disclosure relates to scan-chain testing of an integrated circuit design. More particularly, this disclosure relates to scan-chain testing using a parallel testbench while taking into account register-to-register timing in the scan chain.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Integrated circuit devices may be tested by scan-chain testing, in which a predetermined patterns of 0s and 1s is clocked through the registers of a specific logic path in the integrated circuit device. The output of the path would be expected to have a particular output pattern, based on the logic between registers, if the device is functioning correctly. If the output pattern is not the pattern that is expected, it may indicate an error in the logic design, or a process fault during fabrication. However, as scan chain paths become longer (e.g., because devices have become larger), the time needed to clock a test pattern through a scan chain may become impractical, particularly when testing for timing closure rather than simply for correct functionality.

SUMMARY

In accordance with implementations of the subject matter of this disclosure, a method of testing an integrated circuit device, that operates at a clock frequency and that has at least one scan chain that includes a plurality of registers separated by combinatorial logic, includes establishing a respective scan chain test pattern for testing the at least one scan chain, the scan chain test pattern including a respective bit for each register in the plurality of registers of the scan chain, determining in advance a respective timing delay for each pair of adjacent registers in the at least one scan chain, and, within a single clock period of the clock frequency, applying, in parallel, each bit of the respective scan chain pattern to a respective register in the plurality of registers in the at least one scan chain, each bit of the respective scan chain pattern being applied to its respective register at a respective temporal offset, within the single clock period, based on the respective timing delay.

A first implementation of such a method may further include observing output, in parallel, of the at least one scan chain, and comparing the observed output to an expected output.

According to a first aspect of that first implementation, establishing the respective scan chain test pattern for testing the at least one scan chain may include establishing a plurality of additional scan chain test patterns for conducting a plurality of scan-chain tests of each scan chain in the at least one scan chain, and, in each one of a plurality of subsequent single periods of the clock frequency, applying, in parallel, each bit of one of the additional scan chain patterns to the respective register in the plurality of registers in the at least one scan chain, observing an additional output of the at least one scan chain, and comparing the observed additional output to an expected additional output.

In a second implementation of such a method, when the integrated circuit device includes a plurality of scan chains, establishing a respective scan chain test pattern for testing the at least one scan chain may include establishing a plurality of scan chain test patterns corresponding to the plurality of scan chains, determining in advance the respective timing delay for each pair of adjacent registers in the at least one scan chain may include determining in advance a separate set of respective timing delays for each pair of adjacent registers in each separate scan chain in the plurality of scan chains, and applying, in parallel, each bit of the respective scan chain pattern to a respective register in the plurality of registers in the at least one scan chain may include applying, in parallel, each bit of each respective scan chain pattern to a respective register in the plurality of registers in a respective one of the plurality of scan chains.

A first aspect of that second implementation may further include observing output, in parallel, of respective ones of the plurality of scan chains, and comparing each observed output to a respective expected output.

In a third implementation of such a method, the temporal offset may be less than 20% of the clock period. According to one aspect of that third implementation, wherein the temporal offset may be greater than 10% of the clock period.

In a fourth implementation of such a method, a sum of a register data propagation time, a register setup/hold time, and the temporal offset, may at most equal the single clock period.

In a fifth implementation of such a method, determining in advance a respective timing delay for each pair of adjacent registers in the at least one scan chain may include performing a timing annotation analysis. According to an aspect of that fifth implementation, performing a timing annotation analysis may include performing a Standard Delay Format analysis.

In accordance with implementations of the subject matter of this disclosure, testing apparatus, for testing an integrated circuit device that operates at a clock frequency and that has at least one scan chain that includes a plurality of registers separated by combinatorial logic, includes a test pattern generator configured to establish a respective scan chain test pattern for testing the at least one scan chain, the scan chain test pattern including a respective bit for each register in the plurality of registers of the scan chain, a timing module configured to determine in advance a respective timing delay for each pair of adjacent registers in the at least one scan chain, and a test signal module configured to, within a single clock period of the clock frequency, apply in parallel each bit of the respective scan chain pattern to a respective register in the plurality of registers in the at least one scan chain, each bit of the respective scan chain pattern being applied to its respective register at a respective temporal offset, within the single clock period, based on the respective timing delay.

A first implementation of such testing apparatus may further include a test signal observation module configured to record, in parallel, output of all registers of the at least one scan chain, and a comparison module configured to compare the recorded output to an expected output.

According to a first aspect of that first implementation, the test pattern generator may be configured to establish a plurality of additional scan chain test patterns for conducting a plurality of scan-chain tests of each scan chain in the at least one scan chain, the test signal module may further be configured to, in each one of a plurality of subsequent single periods of the clock frequency, apply in parallel each bit of one of the additional scan chain patterns to the respective register in the plurality of registers in the at least one scan chain, the test signal observation module may further be configured to record an additional output of the at least one scan chain in each one of the plurality of subsequent single periods of the clock frequency, and the comparison module may further be configured to compare the observed additional output to an expected additional output.

In a second implementation of such testing apparatus, when the integrated circuit device includes a plurality of scan chains, the test pattern generator may be configured to establish a plurality of scan chain test patterns corresponding to the plurality of scan chains, the timing module may be configured to determine in advance a separate set of respective timing delays for each pair of adjacent registers in each separate scan chain in the plurality of scan chains, and the test signal module may be configured to apply, in parallel, each bit of each respective scan chain pattern to a respective register in the plurality of registers in a respective one of the plurality of scan chains.

An aspect of that second implementation may further include a test signal observation module configured to, for each respective one of the plurality of scan chains, record in parallel outputs of all registers in the respective one of the plurality of scan chains, and a comparison module configured to compare each observed output to a respective expected output.

In a third implementation of such testing apparatus, the test signal module may be configured to apply each bit of the respective scan chain pattern at a temporal offset that is less than 20% of the clock period. According to an aspect of that third implementation, the test signal module may be configured to apply each bit of the respective scan chain pattern at a temporal offset that is greater than 10% of the clock period.

In a fourth implementation of such testing apparatus, the test signal module may be configured to apply each bit of the respective scan chain pattern at a temporal offset that, when added to a register data propagation time and a register setup/hold time, at most equals the single clock period.

In a fifth implementation of such testing apparatus, the timing module may be configured to determine in advance the respective timing delay using a timing annotation analysis. According to an aspect of that fifth implementation, the timing module may be configured to determine in advance the respective timing delay using Standard Delay Format analysis.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
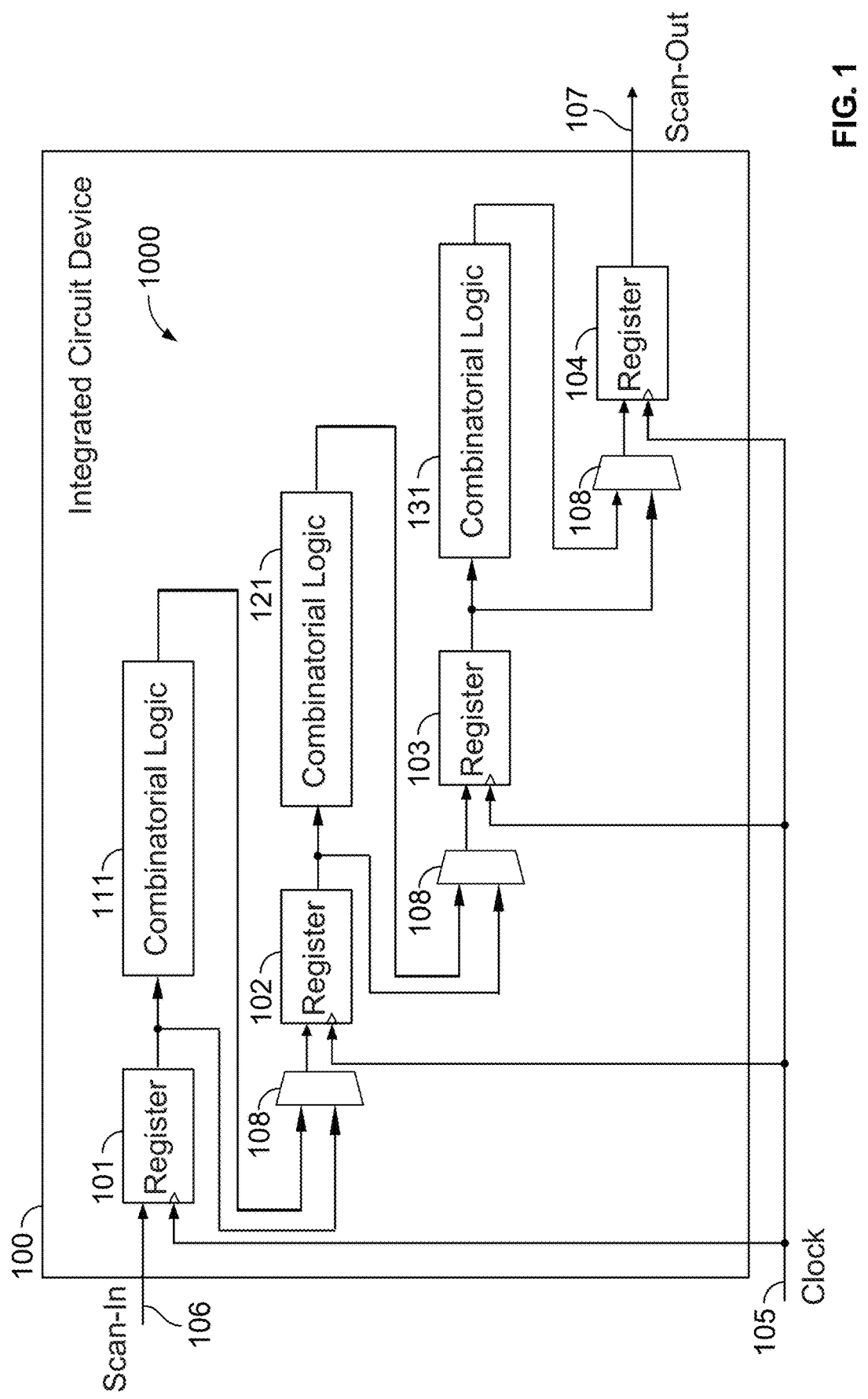
FIG. 1 shows a simplified integrated circuit device that may be tested according to implementations of the subject matter of this disclosure.

As noted above, integrated circuit devices may be tested by scan-chain testing, in which a predetermined patterns of 0s and 1s is clocked through the registers of a specific logic path in the integrated circuit device. The output of the path would be expected to have a particular output pattern, based on the logic between registers, if the device is functioning correctly. If the output pattern is not the pattern that is expected, it may indicate an error in the logic design, or a process fault during fabrication. However, as scan chain paths become longer (e.g., because devices have become larger), the time needed to clock a test pattern through a scan chain may become impractical. For example, if a scan chain includes one million registers, one million clock cycles would be required for the beginning of the scan pattern to advance from the scan chain input to the scan chain output, and another one million cycles for the end of the scan pattern to emerge from the scan chain output. Thus, as an example, given a one-million-register scan chain and a 1 MHz clock, it would require one second for the scan output to begin to emerge, and one more second for the end of the scan output to emerge.

While a long scan chain could be broken up into multiple shorter scan chains that could be tested simultaneously, and compression techniques are available to reduce the load time of the scan chain data, it is generally necessary to test not only for proper functionality, but also for proper timing closure, taking into account propagation time through the combinatorial logic between registers. Therefore, it may not be sufficient to pass a single test pattern through the scan chain. Rather, to test timing closure, it may be necessary to run a large number of simulated test patterns through the scan chain, greatly expanding the time required to test a device.

One way to shorten the time required for scan chain testing, which therefore would allow more simulated patterns to be tested, is to use, rather than a serial testbench which requires that the test pattern actually be clocked through the scan chain serially, a parallel "testbench" which applies the test-pattern bits to all of the registers in the scan chain at one time and then reads out the contents of all of the scan-chain registers at one time. A wait of three clock periods may be required—a first clock period for applying the test pattern bits to the registers, a second clock period to allow for register-to-register propagation through combinatorial logic, and a third clock period to read out the results—but that wait would not increase regardless of the length of the scan chain. However, applying the test-pattern bits to all registers at the same time does not take into account the register-to-register path delay caused by the combinatorial logic in the path. Timing-aware testing using a serial testbench to take those delays into account is available, but may not be practical in a finite amount of time, especially for larger devices, because of the large numbers of patterns that must be tested. And up to now, timing-aware testing has not been available for a parallel testbench. Therefore, timing-aware testing has been actually unavailable (in the parallel testbench case) or unavailable as a practical matter (in the serial testbench case) because of the amount of time required, increasing the likelihood that an integrated circuit device would have to be fabricated after insufficient testing, leading to production of faulty devices, which wastes time and resources, followed by further consumption of time and resources for production of redesigned devices.

Therefore, in accordance with implementations of the subject matter of this disclosure, "timing-annotated" simulations may be carried out using a parallel testbench. Specifically, "standard delay format (SDF)" data may be applied to the test pattern data generated by an automated test pattern generator (ATPG), to derive timing-annotated test patterns in which the register-to-register delay on each register input is included. Then, rather than applying the test-pattern bits simultaneously to each register in the scan chain, all test-pattern bits are applied to their respective registers within the period of a single clock cycle, but are applied at different times during that clock cycle to account for the register-to-register delays. Therefore, when the contents of the registers are read out in parallel on a subsequent clock cycle, the register-to-register delays will have been taken into account. This substantially shortens the time required for individual simulations—including timing-aware simulations—from millions of clock cycles for large devices to as little as a single clock cycle, up to, as discussed above, three clock cycles. Therefore multiple timing-aware simulations, to verify timing for the integrated circuit design, may be conducted in a finite amount of time.

Testing in accordance with the subject matter of this disclosure may be performed, in some implementations, as a simulation to test an integrated circuit design that has not yet been fabricated into an actual integrated circuit device, to verify both function and timing closure of the design before initiating the complex and time-consuming fabrication process. In such implementations, the parallel testbench exists in software, which may be executed on a suitable computing device or workstation. In other implementations, testing in accordance with the subject matter of this disclosure may be performed on actual devices, to verify that process faults did not affect previously validated function and timing closure of the design.

Figure 2:
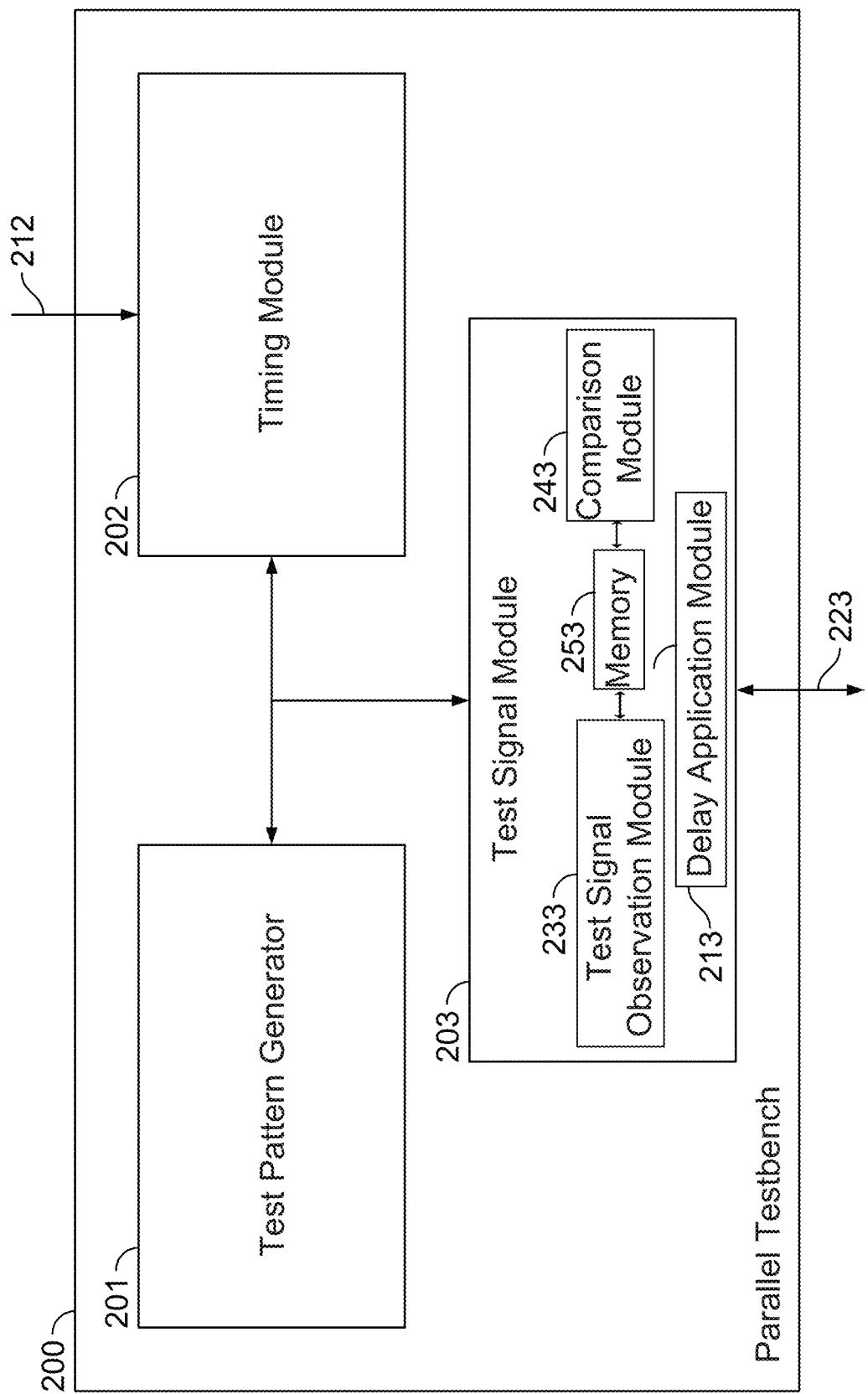
FIG. 2 is a block diagram of a parallel testbench in accordance with implementations of the subject matter of this disclosure.
Figure 3:
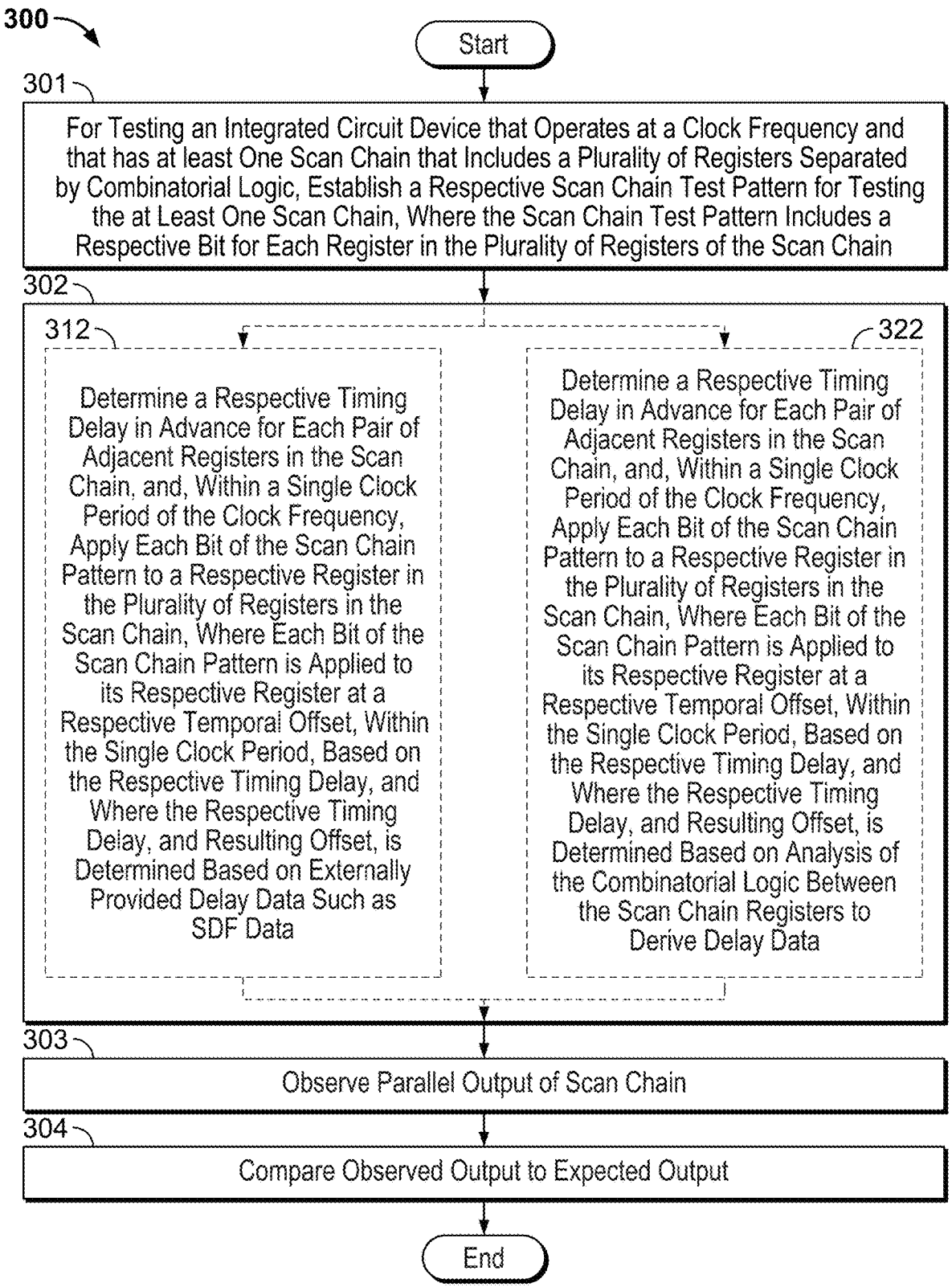
FIG. 3 is a flow diagram illustrating implementations of a method in accordance with the subject matter of this disclosure.

The subject matter of this disclosure may be better understood by reference to FIGS. 1-3.

FIG. 1 shows a simplified integrated circuit device 100 that may be tested according to implementations of the subject matter of this disclosure. As noted above, testing may be performed in software—e.g., as a simulation—to validate the design of integrated circuit device 100—from both functional and timing perspectives—prior to fabrication. Although it may be possible to test an actual fabricated device according to the methods described herein, such actual parallel testing would require providing probe points for each register in the scan chain to be tested.

Integrated circuit device 100 includes a scan chain 1000 that, in this implementation, for illustration purposes, includes only four registers 101, 102, 103, 104, clocked by clock signal 105. Data may be clocked in through SCAN_IN input 106, and may be clocked out through SCAN_OUT output 107. Different groupings 111, 121, 131 of combinatorial logic separate registers 101 and 102, registers 102 and 103, and registers 103 and 104, respectively. Multiplexers 108 allow switching between a pure scan mode for loading the scan chain bits, and a mode in which data propagates from register to register via combinatorial logic 111, 121, 131. The scan chain of a real integrated circuit device (as opposed to this simplified example) may contain hundreds of thousands, or millions, of registers, but the illustrated scan chain of four registers 101-104 suffices to illustrate the subject matter of this disclosure.

Scan pattern data clocked serially from scan input 106 to scan output 107 advances one register on each cycle of clock signal 105. However, the scan pattern data may not propagate instantaneously from register to register on each rising clock edge. Rather, while propagation occurs within one clock period, the portion of a clock period required for propagation from a first particular register to a second particular register depends on the nature of the grouping of combinatorial logic 111, 121, 131, between those first and second particular registers. In some implementations, for example, the clock period may be 10 ns (i.e., at a frequency of 100 MHz), while the propagation offset between registers may be anywhere between 1.2 ns and 1.4 ns, or, generally between 10% and 20% of the clock period in that example.

More generally, there is no specific relationship between the propagation offset and the clock period. The propagation offset can be as long as the difference between the clock period and the sum of the clock-to-data ("C-Q") time of an individual register and the setup/hold margin of an individual register. That is, the sum of the C-Q time, the propagation offset, and the setup/hold margin may be no longer than the clock period.

Although only one scan chain 1000 is shown in integrated circuit device 100, integrated circuit device 100 may have multiple scan chains 1000.

In accordance with implementations of the subject matter of this disclosure, a parallel testbench may be provided which takes register-to-register delay resulting from the combinatorial logic into account in applying scan-chain data to the registers of a scan chain, even in parallel. That is, even though the parallel testbench applies all scan-chain bits to their respective scan-chain registers within a single clock cycle, individual scan-chain bits are applied to respective individual registers at different points within that single clock cycle—i.e., at different offsets from the beginning of that single clock cycle—according to the appropriate register-to-register delay.

As noted above, in many implementations, testing by the parallel testbench is performed as a simulation for an integrated circuit design that has not yet been fabricated, with the parallel testbench implemented as software running on a suitable computing device. Nevertheless, for purposes of illustration, parallel testbench 200 may be visualized in the block diagram form shown in FIG. 2. Moreover, parallel testbench 200 may be provided, rather than as software running on a computing device, as a dedicated hardware device capable of performing simulated scan-chain testing, with a hardware module such as hard-wired circuitry or firmware or a programmed processor performing the function of each of the functional blocks.

Parallel testbench 200 includes a test pattern generator 201 that generates simulated test patterns for testing scan chain 1000, with each test pattern including a respective bit for each register (e.g., registers 101-104) in scan chain 1000. Test pattern generator 201 may be similar to known automated test pattern generators (ATPGs).

Timing module 202 determines the respective register-to-register timing delays that will be added to, or annotated upon, the test patterns created by test pattern generator 201. Timing module 202 may accept Standard Delay Format (SDF) annotation data from an external source at input 212, or may perform the SDF analysis on its own. Timing module 202 uses the SDF data (whether generated internally or externally) to determine for the ith register (e.g., the ith one of registers 101-104) a time delay or offset $\Delta t_i$.

Test signal module 203 uses the various values of $\Delta t_i$ generated by timing module 202 to "annotate" the test patterns generated by test pattern generator 201. Specifically, delay application module 213 of test signal module 203 uses the $\Delta t_i$ values to delay application of the ith test bit to the ith register. If the clock period during which parallel testbench 200 is applying a test pattern begins at a time $t_0$, then instead of applying all test pattern bits to all registers at time $t_0$, test signal module 203 applies each ith test bit to the ith register at time $t_0+\Delta t_i$, via input/output 223. When the values in the scan-chain registers (e.g., registers 101-104) are then read out, in parallel, also via input/output 223, before the beginning of a subsequent clock cycle, those values will correctly reflect register-to-register timing because of the application of the offsets $\Delta t_i$.

Test signal module 203 includes test signal observation module 233 to observe and record the output signals of the scan chain registers retrieved via input/output 223, as well as comparison module 243 to compare the observed scan chain outputs with expected outputs (which may be stored, e.g., in memory 253).

If integrated circuit device 100 has multiple scan chains 1000, then parallel testbench 200 can test each scan chain 1000. Test pattern generator 201 will derive respective test patterns for each of the scan chains 1000, and timing module 202 will determine the respective register-to-register timing delays in each scan chain that will be added to, or annotated upon, the various test patterns created by test pattern generator 201 for the various scan chains. All of the scan chains 1000 may be subject to parallel testing simultaneously, or each scan chain 1000 may be subject to parallel testing at separate times. In either case, multiple scan chain test patterns generated by test pattern generator 201 may be applied, with timing annotations, to test each scan chain 1000 multiple times.

One implementation, according to the subject matter of this disclosure, of a method 300 of operation of parallel testbench 200 is shown in FIG. 3, and begins at 301 where, for testing an integrated circuit device that operates at a clock frequency and that has at least one scan chain that includes a plurality of registers separated by combinatorial logic, a respective scan chain test pattern is established for testing the at least one scan chain. The scan chain test pattern includes a respective bit for each register in the plurality of registers of the scan chain.

At 302, a respective timing delay is determined in advance for each pair of adjacent registers in the scan chain, and within a single clock period of the clock frequency, each bit of the scan chain pattern is applied to a respective register in the plurality of registers in the scan chain. Each bit of the scan chain pattern is applied to its respective register at a respective temporal offset, within the single clock period, based on the respective timing delay. The respective timing delay, and resulting offset, may be determined, as at 312, based on externally provided delay data such as SDF data, or may be determined based on analysis, by timing module 202, of the combinatorial logic between the scan chain registers, to derive the delay data.

At 303, the parallel output of the scan chain may be observed (e.g., on a subsequent clock cycle), and at 304 the observed output may be compared to an expected output to determine whether the integrated circuit design meets functional and timing closure requirements, and method 300 ends.

Thus it is seen that scan-chain testing using a parallel testbench, while taking into account register-to-register timing in the scan chain, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method of testing an integrated circuit device that operates at a clock frequency and that has at least one scan chain that includes a plurality of registers separated by combinatorial logic, the method comprising:
   establishing a respective scan chain test pattern for testing the at least one scan chain, the scan chain test pattern including a respective bit for each register in the plurality of registers of the scan chain;
   determining in advance a respective timing delay for each pair of adjacent registers in the at least one scan chain; and
   within a single clock period of the clock frequency, applying, in parallel, each bit of the respective scan chain pattern to a respective register in the plurality of registers in the at least one scan chain, each bit of the respective scan chain pattern being applied to its respective register at a respective temporal offset, within the single clock period, based on the respective timing delay.

2. The method of testing according to claim 1, further comprising:
   observing output, in parallel, of the at least one scan chain; and
   comparing the observed output to an expected output.

3. The method of testing according to claim 2 wherein:
   establishing the respective scan chain test pattern for testing the at least one scan chain comprises establishing a plurality of additional scan chain test patterns for conducting a plurality of scan-chain tests of each scan chain in the at least one scan chain; and
   in each one of a plurality of subsequent single periods of the clock frequency:
   applying, in parallel, each bit of one of the additional scan chain patterns to the respective register in the plurality of registers in the at least one scan chain;
   observing an additional output of the at least one scan chain; and
   comparing the observed additional output to an expected additional output.

4. The method of testing according to claim 1 wherein, when the integrated circuit device includes a plurality of scan chains:
   establishing a respective scan chain test pattern for testing the at least one scan chain comprises establishing a plurality of scan chain test patterns corresponding to the plurality of scan chains;
   determining in advance the respective timing delay for each pair of adjacent registers in the at least one scan chain comprises determining in advance a separate set of respective timing delays for each pair of adjacent registers in each separate scan chain in the plurality of scan chains; and
   applying, in parallel, each bit of the respective scan chain pattern to a respective register in the plurality of registers in the at least one scan chain comprises applying, in parallel, each bit of each respective scan chain pattern to a respective register in the plurality of registers in a respective one of the plurality of scan chains.

5. The method of testing according to claim 4, further comprising:
observing output, in parallel, of respective ones of the plurality of scan chains; and
comparing each observed output to a respective expected output.

6. The method of testing according to claim 1 wherein the temporal offset is less than 20% of the clock period.

7. The method of testing according to claim 6 wherein the temporal offset is greater than 10% of the clock period.

8. The method of testing according to claim 1 wherein a sum of a register data propagation time, a register setup/hold time, and the temporal offset, at most equals the single clock period.

9. The method of testing according to claim 1 wherein determining in advance a respective timing delay for each pair of adjacent registers in the at least one scan chain comprises performing a timing annotation analysis.

10. The method of testing according to claim 9 wherein performing a timing annotation analysis comprises performing a Standard Delay Format analysis.

11. Testing apparatus for testing an integrated circuit device that operates at a clock frequency and that has at least one scan chain that includes a plurality of registers separated by combinatorial logic, the testing apparatus comprising:
a test pattern generator configured to establish a respective scan chain test pattern for testing the at least one scan chain, the scan chain test pattern including a respective bit for each register in the plurality of registers of the scan chain;
a timing module configured to determine in advance a respective timing delay for each pair of adjacent registers in the at least one scan chain; and
a test signal module configured to, within a single clock period of the clock frequency, apply in parallel each bit of the respective scan chain pattern to a respective register in the plurality of registers in the at least one scan chain, each bit of the respective scan chain pattern being applied to its respective register at a respective temporal offset, within the single clock period, based on the respective timing delay.

12. The testing apparatus of claim 11, further comprising:
a test signal observation module configured to record, in parallel, output of all registers of the at least one scan chain; and
a comparison module configured to compare the recorded output to an expected output.

13. The testing apparatus of claim 12 wherein:
the test pattern generator is configured to establish a plurality of additional scan chain test patterns for conducting a plurality of scan-chain tests of each scan chain in the at least one scan chain;
the test signal module is further configured to, in each one of a plurality of subsequent single periods of the clock frequency, apply in parallel each bit of one of the additional scan chain patterns to the respective register in the plurality of registers in the at least one scan chain;
the test signal observation module is further configured to record an additional output of the at least one scan chain in each one of the plurality of subsequent single periods of the clock frequency; and
the comparison module is further configured to compare the observed additional output to an expected additional output.

14. The testing apparatus of claim 11 wherein, when the integrated circuit device includes a plurality of scan chains:
the test pattern generator is configured to establish a plurality of scan chain test patterns corresponding to the plurality of scan chains;
the timing module is configured to determine in advance a separate set of respective timing delays for each pair of adjacent registers in each separate scan chain in the plurality of scan chains; and
the test signal module is configured to apply, in parallel, each bit of each respective scan chain pattern to a respective register in the plurality of registers in a respective one of the plurality of scan chains.

15. The testing apparatus of claim 14, further comprising:
a test signal observation module configured to, for each respective one of the plurality of scan chains, record in parallel outputs of all registers in the respective one of the plurality of scan chains; and
a comparison module configured to compare each observed output to a respective expected output.

16. The testing apparatus of claim 11 wherein the test signal module is configured to apply each bit of the respective scan chain pattern at a temporal offset that is less than 20% of the clock period.

17. The testing apparatus of claim 16 wherein the test signal module is configured to apply each bit of the respective scan chain pattern at a temporal offset that is greater than 10% of the clock period.

18. The testing apparatus of claim 11 wherein the test signal module is configured to apply each bit of the respective scan chain pattern at a temporal offset that, when added to a register data propagation time and a register setup/hold time, at most equals the single clock period.

19. The testing apparatus of claim 11 wherein the timing module is configured to determine in advance the respective timing delay using a timing annotation analysis.

20. The testing apparatus of claim 19 wherein the timing module is configured to determine in advance the respective timing delay using Standard Delay Format analysis.

* * * * *